(12) United States Patent
Milicevic et al.

(10) Patent No.: US 10,764,078 B2
(45) Date of Patent: Sep. 1, 2020

(54) DIGITAL PREDISTORTION FOR A FREQUENCY-SELECTIVE CHANNEL (71) Applicant: Maxlinear, Inc., Carlsbad, CA (US)

(72) Inventors: Mario Milicevic, Carlsbad, CA (US); Ioannis Spyropoulos, La Jolla, CA (US)

(73) Assignee: MaxLinear, Inc., Carlsbad, CA (US)

(*) Notice: Subject to any disclaimer, the term of this patent is extended or adjusted under 35 U.S.C. 154(b) by 0 days.

(21) Appl. No.: 16/356,077

(22) Filed: Mar. 18, 2019

(65) Prior Publication Data
US 2019/0296929 A1 Sep. 26, 2019

Related U.S. Application Data (60) Provisional application No. 62/646,951, filed on Mar. 23, 2018.

(51) Int. Cl.
H04L 12/28 (2006.01)
H03F 3/24 (2006.01)
H03F 1/32 (2006.01)
H04B 1/10 (2006.01)

(52) U.S. Cl.
CPC ....... H04L 12/2801 (2013.01); H03F 1/3241 (2013.01); H03F 1/3247 (2013.01); H03F 1/3276 (2013.01); H03F 3/245 (2013.01); H04B 1/1018 (2013.01)

(58) Field of Classification Search
CPC ..... H03F 1/08; H03F 1/26; H03F 1/32; H03F 1/3223; H03F 1/3241; H03F 1/3247; H03F 1/3276; H03F 3/24; H03F 3/245; H04B 1/02; H04B 1/04; H04B 1/0408; H04B 1/0425; H04B 1/0433; H04B 1/0441; H04B 1/0475; H04B 1/1018; H04B 2001/0408; H04B 2001/0425; H04B 2001/0433; H04B 2001/0441; H04B 2001/0475; H04L 12/2801; H04L 27/36; H04L 27/367; H04L 27/368
USPC .............. 375/295–297; 381/94.1, 94.2, 94.3; 455/114.2, 114.3
See application file for complete search history.

(56) References Cited

U.S. PATENT DOCUMENTS

| | | | |
|---|---|---|---|
| 8,982,995 B1* | 3/2015 | Van Cai | H04B 1/0475 375/297 |
| 10,411,656 B1* | 9/2019 | Dick | H03F 1/3241 |
| 2008/0130789 A1* | 6/2008 | Copeland | H03F 1/3247 375/297 |
| 2013/0165060 A1* | 6/2013 | Jian | H03H 11/04 455/114.3 |

(Continued)

Primary Examiner — Young T Tse
(74) Attorney, Agent, or Firm — Maschoff Brennan (57) ABSTRACT A transmitter is configured to generate a DOCSIS signal for transmission onto a frequency-selective coaxial cable. The transmitter comprises a first reverse tilt filter circuit, a digital predistortion circuit, a forward tilt filter, a wideband equalizer, a second reverse tilt filter, and a power amplifier. The responses of the tilt filters may be set based on the frequency response of the frequency-selective coaxial cable to which the transmitter is intended to be coupled. The predistortion circuit may compensate for distortion introduced by circuitry of the transmitter. The equalizer circuit may be operable to compensate for undesired linear response of other circuitry of the transmitter.

18 Claims, 4 Drawing Sheets (56) References Cited

U.S. PATENT DOCUMENTS

2017/0104503 A1* 4/2017 Pratt .................... H04B 1/0475
2017/0338842 A1* 11/2017 Pratt ...................... H03F 3/195
2019/0349227 A1* 11/2019 Kim ........................ H03F 1/02
2019/0356345 A1* 11/2019 Ota ...................... H04B 1/0475

* cited by examiner

FIG. 4 ial cable 105.
DIGITAL PREDISTORTION FOR A FREQUENCY-SELECTIVE CHANNEL

PRIORITY CLAIM

This application claims priority to U.S. Provisional Patent Application 62/646,951 titled "Digital Predistortion For A Frequency-Selective Channel" and filed on Mar. 23, 2018, the entirety of which is hereby incorporated herein by reference in its entirety.

BACKGROUND

Limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for digital predistortion for a frequency-selective channel, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Figure 1:
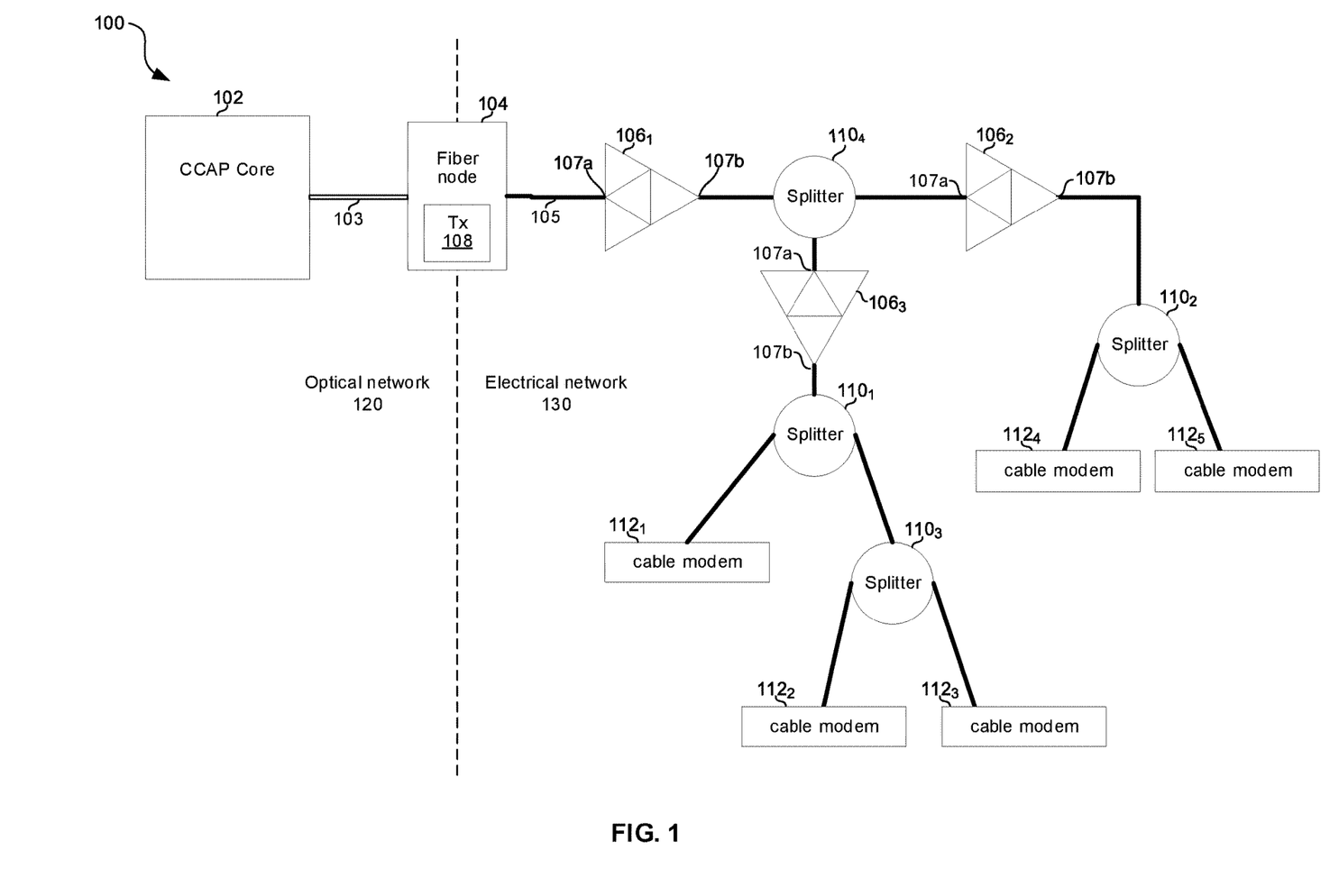
FIG. 1 shows an example frequency-selective network.

FIG. 1 shows an example frequency-selective network. The example frequency-selective network is a hybrid fiber-coaxial (HFC) network 100 comprising a converged cable access platform (CCAP) core 102, a remote-PHY fiber node 104, amplifiers $106_1$-$106_3$, splitters $110_1$-$110_4$, and cable modems $112_1$-$112_5$.

The CCAP core 102 comprises circuitry operable to handle Data-Over-Cable Service Interface Specification (DOCSIS) traffic to and from the cable modems $112_1$-$112_5$. The CCAP core 102 is coupled to the fiber node 104 via fiber 103.

The fiber node 104 comprises circuitry operable to provide an interface between the optical network 120 and the electrical network 130. The coaxial cable over which the fiber node 104 communicates is typically frequency-selective (i.e., the cable has a non-flat channel response such that attenuation of a signal propagating along the cable varies with the frequency of the signal). Also, a power amplifier of the transmitter 108 typically introduces nonlinear distortion into the signal transmitted on to the coaxial cable 105. Accordingly, the transmitter 108 comprises circuitry for performing predistortion to compensate for nonlinearity of its power amplifier while also accounting for the frequency selectivity of the coaxial cable 105.

Each of the amplifiers $106_1$-$106_3$ is a bidirectional amplifier which amplifies downstream signals and upstream signals, where downstream signals are input via upstream interface 107a and output via downstream interface 107b, and upstream signals are input via downstream interface 107b and output via upstream interface 107a. The amplifier $106_1$, which amplifies signals along the main coaxial "trunk," may be referred to as a "trunk amplifier." The amplifiers $106_2$ and $106_3$, which amplify signals along "branches" split off from the trunk, may be referred to as "branch" or "distribution" amplifiers.

Each of the splitters $110_1$-$110_4$ comprises circuitry operable to output signals incident on each of its interfaces onto each of its other interfaces. Each of the splitters $110_1$-$110_4$ may be a passive or active device operable to bidirectionally transfer signals.

Each of the cable modems $112_1$-$112_5$ is operable to communicate with, and be managed by, the CCAP core 102 in accordance with one or more standards (e.g., DOCSIS). Each of the cable modems $112_1$-$112_5$ may reside at the premises of a cable/DOCSIS subscriber.

Figure 2:
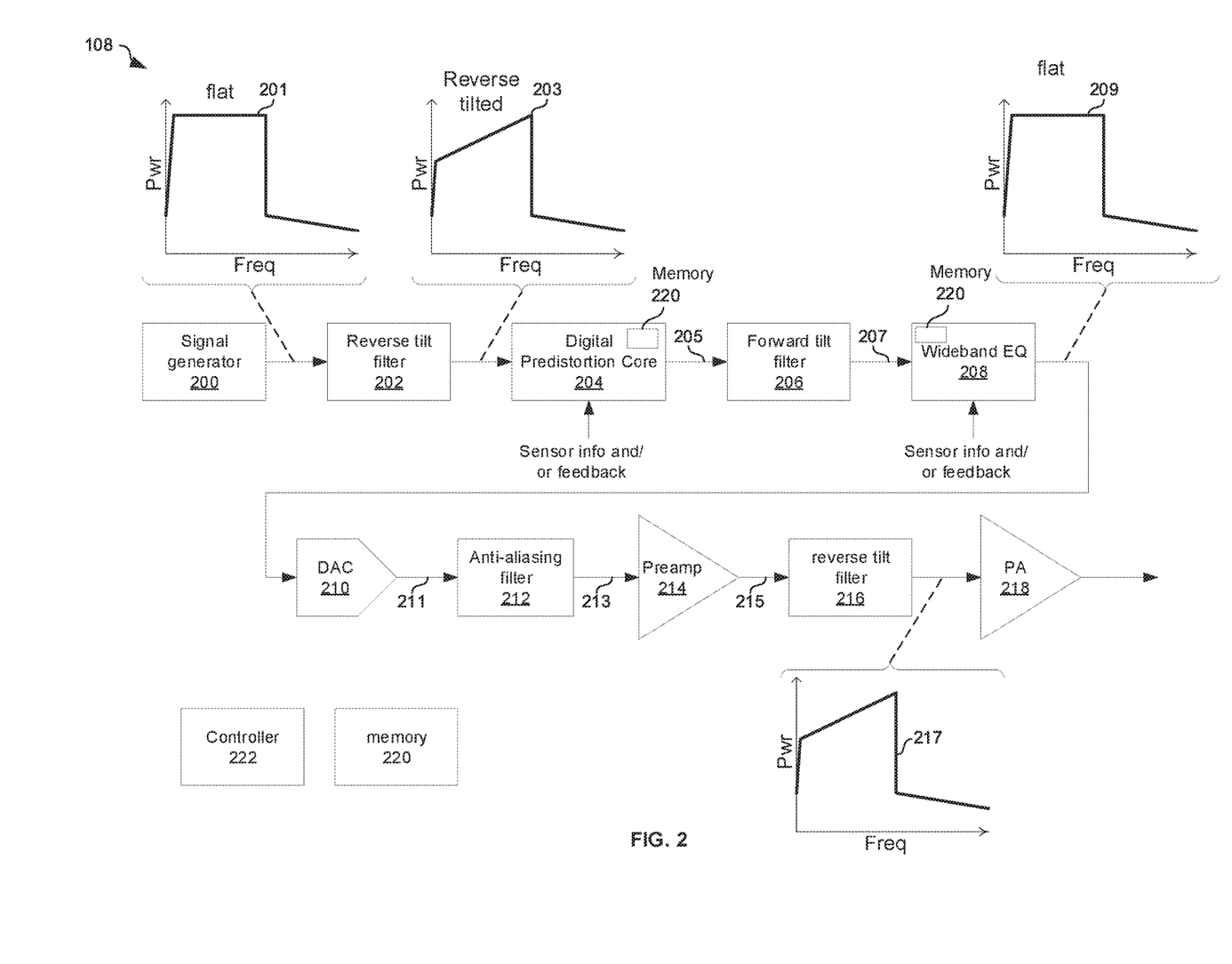
FIG. 2 shows an example implementation of a transmitter operable to perform predistortion for transmission onto a frequency-selective channel.

FIG. 2 shows an example implementation of a transmitter operable to perform predistortion for transmission onto a frequency-selective channel. The transmitter comprises signal generator 200, reverse tilt filter 202, digital predistortion (DPD) core 204, forward tilt filter 206, wideband equalizer 208, digital-to-analog converter (DAC) 210, anti-aliasing filter (AAF) 212, pre-amplifier 214, analog reverse tilt filter 216, power amplifier (PA) 218, memory 220, and controller 222.

The controller 222 comprises circuitry operable to configure and control operations of the transmitter 108. The controller may comprise memory and control logic for reading parameters/settings from memory 220 and writing those parameters to one or more of circuit(s) 200, 202, 204, 206, 208, 210, 212, 214, 216, and/or 218. Similarly, the controller 222 may monitor and/or take measurements of one or more of the circuit(s) 200, 202, 204, 206, 208, 210, 212, 214, 216, and/or 218 and/or signals 201, 203, 205, 207, 209, 211, 213, 215, and 217 and may store the results of the monitoring and/or measurement to memory 220.

The memory 220 may comprise volatile and/or nonvolatile memory.

The signal generator 200 is operable to generate a digital signal according to a standard (e.g., Data-Over-Cable Service Interface Specification 3.0 or 3.1) used on a network over which the transmitter 108 communicates.

The first (digital) reverse tilt filter 202 comprises circuitry operable to process the signal 201 to generate the signal 203. The reverse tilt filter 202 operates to adjust the power spectrum of the signal to increase the power of higher frequencies and/or decrease the power of lower frequencies such that the signal 203 is "reverse tilted" as shown. The filter 202 attempts to introduce a tilt to the signal 203 that is the same as the tilt of the signal 217 input to the PA 218 (which is tilted in the opposite direction of the channel response of the coaxial cable 105).

The digital predistortion (DPD) core 204 comprises circuitry operable to compensate for the nonlinear distortion that will be introduced by downstream circuitry of the transmitter 108 (typically dominated by the nonlinearity of the power amplifier 218). That is, the overall response of the transmitter 108 with DPD core 204 is more-linear than the response of the transmitter 108 without the DPD core 204.

The forward tilt filter 206 comprises circuitry operable to process the signal 205 to generate the signal 207. The forward tilt filter 206 operates to adjust the power spectrum of the signal 205 to decrease the power of higher frequencies and/or increase the power of lower frequencies such that the signal 207 (and 209, after processing by the wideband equalizer 208) is "flat" (i.e., constant attenuation)—or at least "flatter" than signal 205 (i.e., less variation in attenuation than signal 205)—across the frequency range of interest (e.g., the frequency range used for DOCSIS 3.1 signaling). A flat frequency spectrum is desirable at the input of the DAC 210 in order to utilize as much of the dynamic range of the DAC 210 as possible.

The wideband equalizer 208 comprises circuitry operable to compensate for undesired linear response between the output of the DAC 210 and the output of the power amplifier 218. If this was untreated, then the DPD core 204 may try to compensate for it, resulting in the DPD core 204 being less-effective at compensating for the nonlinear distortion. By compensating for undesired linear response, the wideband equalizer 208 allows the DPD core 204 to focus on compensating for nonlinear distortion.

The digital-to-analog converter (DAC) 210 comprises circuitry operable to convert the digital signal 209 to a corresponding analog representation.

The anti-aliasing filter 212 comprises circuitry operable to filter out aliases introduced by the DAC 210.

The pre-amplifier 214 comprises circuitry operable to adjust the level of the signal 213 to generate signal 215.

The second (analog) reverse tilt filter 216 comprises circuitry operable to processes the signal 215 to generate the signal 217. The second (analog) reverse tilt filter 216 operates to adjust the power spectrum of the downstream analog signal to increase the power of higher frequencies and/or decrease the power of lower frequencies to compensate for the frequency selectivity of the coaxial cable such that the signal will be substantially "flat" upon arriving at its destination (e.g., cable modem).

The power amplifier 218 is operable to increase the power of the signal 217 for outputting it onto the coaxial cable with sufficient power to reach its intended destination (e.g., a cable modem).

Figure 3:
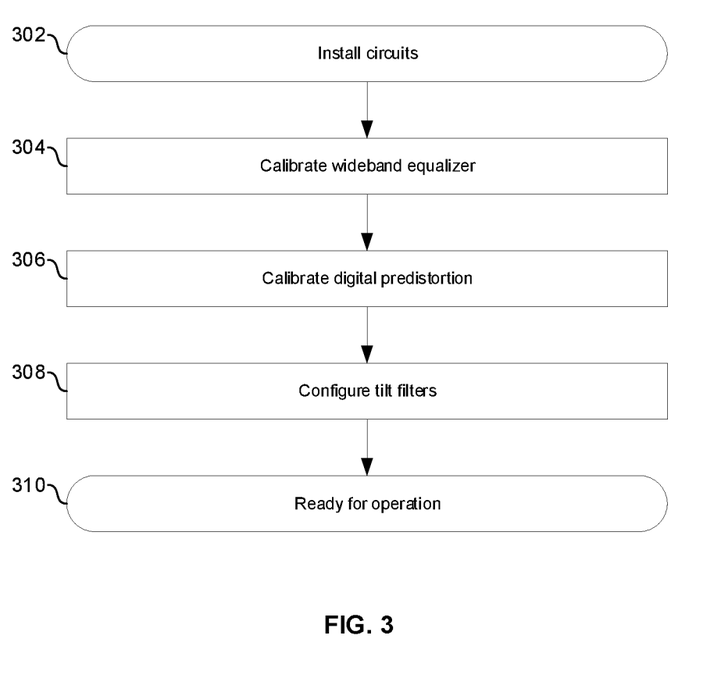
FIG. 3 is a flowchart illustrating an example factory calibration procedure for a transmitter operable to perform predistortion for transmission onto a frequency-selective channel.

FIG. 3 is a flowchart illustrating an example factory calibration procedure for a transmitter operable to perform predistortion for transmission onto a frequency-selective channel.

In block 302, transmitter circuitry is assembled in a factory. For example, one or more pluggable modules comprising the transmitter 108 shown in FIG. 2 are installed into a fiber node 104 that is then hooked up to a test/calibration station.

In block 304, the wideband equalizer circuitry 208 is calibrated to compensate for undesired linear response of the circuitry. Calibration may comprise iteratively trying values for one or more filter tap coefficients and/or or gain stages until optimal coefficients are determined. The optimal coefficients may then be stored in volatile or nonvolatile memory of the transmitter 108.

In block 304, the DPD core circuitry 204 is calibrated to compensate for nonlinear distortion introduced by the transmit circuitry (typically dominated by the nonlinear distortion introduced by the PA 218). Calibration may comprise iteratively trying values for one or more filter tap coefficients and/or or gain stages until optimal coefficients are determined. The optimal coefficients may then be stored into volatile or nonvolatile memory 220. The wideband equalizer 208 is enabled during DPD calibration 306.

In block 308, the tilt filters 202 and 206 of the transmitter 108 are configured (e.g., via one or more physical switches and/or via a setting of values of one or more hardware or software registers by the test/calibration station) based on the tilt needed for the network into which the fiber node 104 will be installed.

In block 310, calibration of the transmitter 108 is complete and the fiber node 104 is ready for installation in a network such as the network of FIG. 1.

Figure 4:
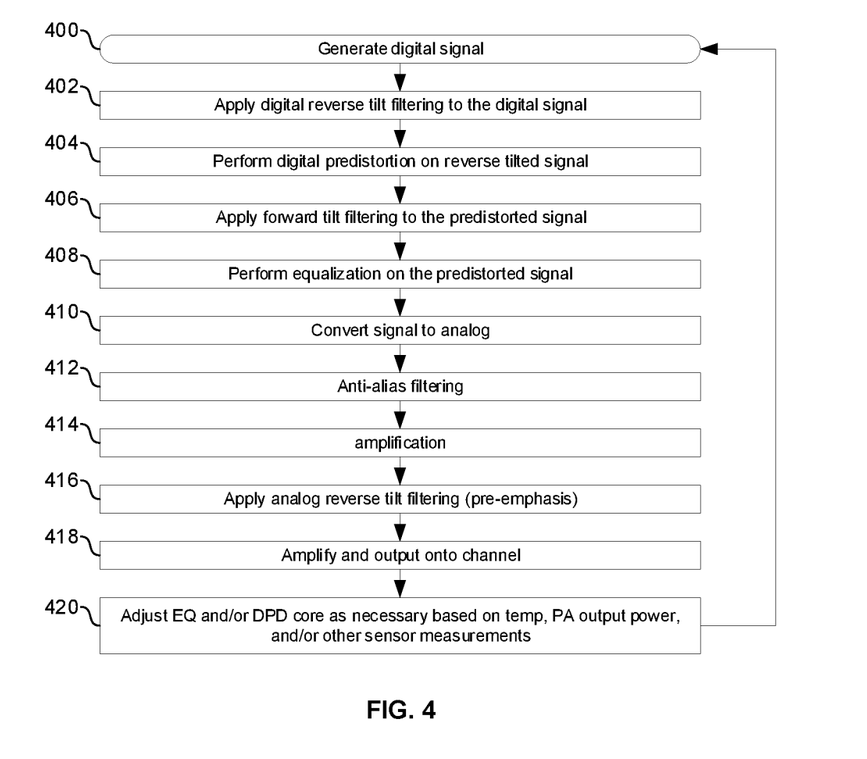
FIG. 4 is a flowchart illustrating operation of an example transmitter operable to perform predistortion for transmission onto a frequency-selective channel.

FIG. 4 is a flowchart illustrating operation of an example transmitter operable to perform predistortion for transmission onto a frequency-selective channel.

In block 400, a digital signal 201 to be transmitted is generated by the transmitter 108.

In block 402, the digital signal 201 has a reverse tilt applied to it by filter 202, resulting in signal 203.

In block 404, the signal 203 is predistorted by DPD core 204, the predistortion resulting in signal 205. The predistortion uses coefficients selected (e.g., based on sensor information such as the output power of the PA 218 and the current temperature) from a set of coefficients previously determined during calibration of the transmitter 108 (e.g., using the process of FIG. 3).

In block 406, the signal 205 has a forward tilt applied by filter 206, resulting in signal 207. Signal 207 is substantially flat across the frequency band of interest (e.g., across the ~1 GHz DOCSIS band) (i.e., the power level is within determined upper and lower bounds across the frequency band of interest).

In block 408, signal 207 is processed by the wideband equalizer 208, resulting in signal 209. The equalization uses coefficients selected (e.g., based on sensor information such as the output power of the PA 218 and the current temperature) from a set of coefficients previously determined during calibration of the transmitter 108 (e.g., using the process of FIG. 3).

In block 410, signal 209 is converted to a corresponding analog representation 211.

In block 412, signal 211 is filtered by AAF 212 to remove aliases introduced by DAC 210, resulting in signal 213.

In block 414, the signal 213 is amplified by preamplifier 214, resulting in signal 215.

In block 416, the signal 215 is reverse tilted by filter 216 to compensate for the frequency dependent loss of the channel (e.g., coaxial cable) onto which the signal is to be transmitted. The output of filter 216 is signal 217.

In block 418, the signal 217 is amplified by power amplifier 218 and output onto the frequency-selective channel.

In block 420, the wideband equalizer 208 and/or DPD core 204 are adjusted (e.g., different filter tap coefficients are selected) based on temperature, PA output power, and/or other sensor data and/or feedback of one or more of the signals shown in FIG. 2.

The process then returns to block 400 for the next transmission.

In accordance with an example implementation of this disclosure, a transmitter (e.g., 108) is configured to generate a DOCSIS signal for transmission onto a frequency-selective coaxial cable. The transmitter comprises a first (digital) reverse tilt filter circuit (e.g., 202) operable to receive a first signal (e.g., 201) occupying a band of frequencies, and generate a reverse-tilted signal (e.g., 203) by filtering of the first signal to decrease strength of lower-frequency components of the first signal and/or increase strength of higher-frequency components of the first signal. The transmitter comprises a digital predistortion circuit (e.g., 204) that is downstream from the first (digital) reverse tilt filter (i.e., in a signal path of the signal output by the first (digital) reverse tilt filter, possibly with one or more intermediary circuits) and operable to distort a signal (e.g., 203) input to the digital predistortion circuit (e.g., 204) to compensate for distortion introduced by downstream circuitry of the transmitter. The transmitter comprises a forward tilt filter circuit (e.g., 206) that is downstream from the digital predistortion circuit and is operable to filter a signal (e.g., 205) input to the forward tilt filter circuit to increase strength of lower-frequency components of the signal input to the forward tilt filter circuit and/or decrease strength of higher-frequency components of the signal input to the forward tilt filter circuit. The transmitter comprises an equalizer circuit (e.g., 208) that is downstream from the forward tilt filter. The transmitter comprises a digital-to-analog converter (e.g., 210) that is downstream from the equalizer circuit. The transmitter comprises a second (analog) reverse tilt filter (e.g., 216) that is downstream from the equalizer circuit and is operable to filter a signal (e.g., 215) input to the second (analog) reverse tilt filter circuit to decrease the strength of lower-frequency components of the signal input to the second (analog) reverse tilt filter circuit and/or increase the strength of higher-frequency components of the signal input to the second (analog) reverse tilt filter circuit. The transmitter comprises a power amplifier (e.g., 218) that is downstream from the second (analog) reverse tilt filter and operable to amplify its input signal for output onto the coaxial cable. The transmitter may comprise volatile or nonvolatile memory (e.g., 220) in which values are stored for adaptation of the operation of the digital predistortion circuit and/or equalizer circuit during operation of the transmitter. The digital predistortion circuit may be configured such that its filter tap coefficients are adaptable during operation of the transmitter, based on one or more feedback signals and/or sensor outputs. The equalizer circuit may be configured such that its filter tap coefficients are adaptable during operation of the transmitter, based on one or more feedback signals and/or sensor outputs. The equalizer circuit may be configured to compensate for undesired linear response introduced by circuitry (e.g., 210, 212, 214, 216, and/or 218) of the transmitter. The transmitter may be a transmitter of a DOCSIS fiber node.

In accordance with an example implementation of this disclosure, a transmitter circuit (e.g., 108) comprises a first (digital) reverse tilt filter circuit (e.g., 202), a digital predistortion circuit (e.g., 204), and a forward tilt filter circuit (e.g., 206). The first (digital) reverse tilt filter circuit is operable to receive a first signal (e.g., 201) occupying a band of frequencies, and generate a reverse-tilted signal (e.g., 203) by filtering of the first signal to decrease strength of lower-frequency components of the first signal and/or increase strength of higher-frequency components of the first signal. The digital predistortion circuit is operable to generate a pre-distorted, reverse-tilted signal (e.g., 205) by distortion of the reverse-tilted signal. The forward tilt filter is operable to generate a third signal (e.g., 207) by filtering of the pre-distorted, reverse-tilted signal to increase strength of lower-frequency components of the pre-distorted, reverse-tilted signal and/or decrease strength of higher-frequency components pre-distorted, reverse-tilted signal. The transmitter comprises a second (analog) reverse tilt filter (e.g., 216) downstream from the forward tilt filter (i.e., in a signal path of the signal output by forward tilt filter, possibly with one or more intermediary circuits). The second (analog) reverse tilt filter is operable to receive a fourth signal (e.g., 215) and generate a fifth signal (e.g., 217) by filtering of the fourth signal to decrease strength of lower-frequency components of the fourth signal and/or increase strength of higher-frequency components of the fourth signal. The response of the first (digital) reverse tilt filter and second (analog) reverse tilt filter may be set based on the frequency response of the frequency-selective coaxial cable to which the transmitter intended to be coupled. The transmitter may comprise an equalizer circuit (e.g., 208) downstream from the forward tilt filter, and the equalizer may be operable to compensate for undesired linear response of circuitry (e.g., 210, 212, 214, 216, and/or 218) of the transmitter. The transmitter may comprise volatile or nonvolatile memory (e.g., 220) that holds a plurality of parameter values for use in configuration of the digital predistortion circuit and/or the wideband equalizer circuit. The transmitter may be operable to select, during operation (e.g., while registered with a DOCSIS network), which of the values to use in the digital predistortion circuit and/or wideband equalizer circuit based on sensor information and/or feedback of a signal generated by the transmitter circuit.

As utilized herein, the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set $\{(x), (y), (x, y)\}$. In other words, "x and/or y" means "one or both of x and y". As another example, "x, y, and/or z" means any element of the seven-element set $\{(x), (y), (z), (x, y), (x, z), (y, z), (x, y, z)\}$. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application-specific integrated circuit (ASIC) or chip.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
a transmitter configured to generate a Data-Over-Cable Service Interface Specification (DOCSIS) signal for transmission onto a frequency-selective coaxial cable, wherein the transmitter comprises:
a first reverse tilt filter circuit operable to:
receive a first signal occupying a band of frequencies, and
generate a reverse-tilted signal by filtering of the first signal to decrease strength of lower-frequency components of the first signal and/or increase strength of higher-frequency components of the first signal;
a digital predistortion circuit that is downstream from the first reverse tilt filter circuit and operable to distort the reverse-tilted signal input to the digital predistortion circuit to compensate for distortion introduced by the transmitter;
a forward tilt filter circuit that is downstream from the digital predistortion circuit and is operable to filter a signal input to the forward tilt filter circuit to increase strength of lower-frequency components of the signal input to the forward tilt filter circuit and/or decrease strength of higher-frequency components of the signal input to the forward tilt filter circuit;
an equalizer circuit that is downstream from the forward tilt filter circuit and operable to compensate for undesired linear response introduced by the transmitter;
a digital-to-analog converter that is downstream from the equalizer circuit;
a second reverse tilt filter circuit that is downstream from the digital-to-analog converter and is operable to filter a signal input to the second reverse tilt filter circuit to decrease strength of lower-frequency components of the signal input to the second reverse tilt filter circuit and/or increase strength of higher-frequency components of the signal input to the second reverse tilt filter circuit; and a power amplifier that is downstream from the second reverse tilt filter circuit and operable to amplify a signal tilted by the second reverse tilt filter circuit for output onto the coaxial cable.

2. The system of claim 1, wherein the transmitter further comprises volatile or nonvolatile memory in which values are stored for adaptation of operation of the digital predistortion circuit during operation of the transmitter.

3. The system of claim 2, wherein the digital predistortion circuit is configured such that filter tap coefficients are adaptable during operation of the transmitter based on one or more feedback signals and/or sensor outputs generated by the transmitter.

4. The system of claim 1, wherein the transmitter further comprises volatile or nonvolatile memory in which values are stored for adaptation of operation of the equalizer circuit during operation of the transmitter.

5. The system of claim 4, wherein the equalizer circuit is configured such that filter tap coefficients are adaptable during operation of the transmitter based on one or more feedback signals and/or sensor outputs generated by the transmitter.

6. The system of claim 1, wherein the transmitter is a transmitter of a DOCSIS fiber node.

7. A method comprising:
in a Data-Over-Cable Service Interface Specification (DOCSIS) transmitter comprising a first reverse tilt filter circuit, a digital predistortion circuit downstream from the first reverse tilt filter circuit, a forward tilt filter circuit downstream from the digital predistortion circuit, an equalizer circuit downstream from the forward tilt filter circuit, a digital-to-analog converter circuit downstream from the equalizer circuit, a second reverse tilt filter circuit downstream from the digital-to-analog converter circuit, and a power amplifier downstream from the second reverse tilt filter circuit:
receiving, by the first reverse tilt filter circuit, a first signal occupying a band of frequencies;
filtering, by the first reverse tilt filter circuit, the first signal to decrease strength of lower-frequency components of the first signal and/or increase strength of higher-frequency components of the first signal;
distorting, by the digital predistortion circuit, a signal input to the digital predistortion circuit from the first reverse tilt filter circuit to compensate for distortion introduced by the transmitter;
filtering, by the forward tilt filter circuit, a signal input to the forward tilt filter circuit from the digital predistortion circuit to increase strength of lower-frequency components of the signal input to the forward tilt filter circuit and/or decrease strength of higher-frequency components of the signal input to the forward tilt filter circuit;
equalizing, by the equalizer circuit from the forward tilt filter circuit, a signal input to the equalizer circuit;
converting, by the digital-to-analog converter circuit, a digital signal input to the digital-to-analog converter circuit from the equalizer circuit to an analog signal;
filtering, by the second reverse tilt filter circuit, a signal input to the second reverse tilt filter circuit from the digital-to-analog converter circuit to decrease strength of lower-frequency components of the signal input to the second reverse tilt filter circuit and/or increase strength of higher-frequency components of the signal input to the second reverse tilt filter circuit; and amplifying, by the power amplifier, a signal tilted by the second reverse tilt filter circuit for output onto a coaxial cable.

8. The method of claim 7, wherein the transmitter further comprises volatile or nonvolatile memory in which values are stored for adapting operation of the digital predistortion circuit during operation of the transmitter.

9. The method of claim 8, further comprising adapting, by the digital predistortion circuit during operation of the transmitter, filter tap coefficients used for the distorting, wherein the adapting is based on one or more feedback signals and/or sensor outputs generated by the transmitter.

10. The method of claim 7, wherein the transmitter further comprises volatile or nonvolatile memory in which values are stored for adapting operation of the equalizer circuit during operation of the transmitter.

11. The method of claim 10, further comprising adapting, by the equalizer circuit during operation of the transmitter, filter tap coefficients used for the equalizing, wherein the adapting is based on one or more feedback signals and/or sensor outputs generated by the transmitter.

12. The method of claim 7, wherein the equalizer circuit is configured to compensate for undesired linear response introduced by the transmitter.

13. The method of claim 7, wherein the transmitter is a transmitter of a DOCSIS fiber node.

14. A system comprising:
a transmitter circuit comprising a first reverse tilt filter circuit, a digital predistortion circuit, and a forward tilt filter circuit, wherein:
the first reverse tilt filter circuit is operable to:
receive a first signal occupying a band of frequencies, and
generate a reverse-tilted signal by filtering of the first signal to decrease strength of lower-frequency components of the first signal and/or increase strength of higher-frequency components of the first signal;
the digital predistortion circuit is operable to generate a pre-distorted, reverse-tilted signal by distortion of the reverse-tilted signal; and
the forward tilt filter circuit is operable to generate a second signal by filtering of the pre-distorted, reverse-tilted signal to increase strength of lower-frequency components of the pre-distorted, reverse-tilted signal and/or decrease strength of higher-frequency components of the pre-distorted, reverse-tilted signal.

15. The system of claim 14, wherein:
the transmitter circuit further comprises a second reverse tilt filter circuit downstream from the forward tilt filter circuit; and
the second reverse tilt filter circuit is operable to:
receive a third signal tilted by the forward tilt filter circuit, and
generate a fourth signal by filtering of the third signal to decrease strength of lower-frequency components of the third signal and/or increase strength of higher-frequency components of the third signal.

16. The system of claim 14, wherein response of the first reverse tilt filter circuit and response of the second reverse tilt filter circuit are set based on a frequency response of a frequency-selective coaxial cable to which the transmitter circuit intended to be coupled.

17. The system of claim 14, wherein:
the transmitter circuit further comprises an equalizer circuit downstream from the forward tilt filter circuit; and
the equalizer is operable to compensate for undesired linear response of the transmitter circuit.

18. The system of claim 17, wherein:
the transmitter circuit further comprises volatile or nonvolatile memory that holds a plurality of parameter values for use in configuration of the digital predistortion circuit and/or the equalizer circuit; and
the transmitter circuit is operable to select, during operation of the transmitter circuit, which of the parameter values to use in the digital predistortion circuit and/or the equalizer circuit based on sensor information and/or feedback of a signal generated by the transmitter circuit.

* * * * *